United States Patent
Hsieh et al.

(10) Patent No.: US 9,627,577 B2
(45) Date of Patent: Apr. 18, 2017

(54) SEMICONDUCTOR LIGHT-EMITTING DEVICE AND METHOD FOR FORMING THE SAME

(71) Applicant: EPISTAR CORPORATION, Hsin-Chu (TW)

(72) Inventors: Min-Hsun Hsieh, Hsin-Chu (TW); Chia-Fen Tsai, Hsin-Chu (TW)

(73) Assignee: EPISTAR CORPORATION, Hsin-Chu (TW)

(*) Notice: Subject to any disclaimer, the term of this patent is extended or adjusted under 35 U.S.C. 154(b) by 0 days.

(21) Appl. No.: 14/507,445

(22) Filed: Oct. 6, 2014

(65) Prior Publication Data

US 2015/0044794 A1    Feb. 12, 2015

Related U.S. Application Data

(60) Division of application No. 13/045,202, filed on Mar. 10, 2011, now Pat. No. 8,853,722, which is a division of application No. 11/160,588, filed on Jun. 29, 2005, now Pat. No. 7,928,455, which is a
(Continued)

(30) Foreign Application Priority Data

Jul. 15, 2002 (TW) .................. 091114688 A
Sep. 1, 2004 (TW) .................. 093126439 A

(51) Int. Cl.
*H01L 27/15* (2006.01)
*H01L 33/00* (2010.01)
*H01L 33/40* (2010.01)
*H01L 33/46* (2010.01)
(Continued)

(52) U.S. Cl.
CPC ........ *H01L 33/005* (2013.01); *H01L 33/0079* (2013.01); *H01L 33/405* (2013.01); *H01L 33/46* (2013.01); *H01L 33/50* (2013.01); *H01L 33/505* (2013.01); *H01L 33/42* (2013.01); *H01L 2933/0016* (2013.01); *H01L 2933/0033* (2013.01); *H01L 2933/0041* (2013.01)

(58) Field of Classification Search
CPC ... H01L 33/0079; H01L 33/405; H01L 33/46; H01L 33/50; H01L 33/505
See application file for complete search history.

(56) References Cited

U.S. PATENT DOCUMENTS

2001/0004112 A1* 6/2001 Furukawa et al. ............. 257/7
2002/0011601 A1* 1/2002 Furukawa et al. ............ 257/98
(Continued)

OTHER PUBLICATIONS

Horng et al. (AlGaInP light-emitting diodes with mirror substrates fabricated by wafer bonding, Applied Physics Letters vol. 75.).*

*Primary Examiner* — Marc Armand
*Assistant Examiner* — Sarah Salerno
(74) *Attorney, Agent, or Firm* — Muncy, Geissler, Olds & Lowe, P.C.

(57) ABSTRACT

A method of applying a fluorescent material to a surface includes providing a substrate, providing a semiconductor light-emitting stack on the substrate, bonding the substrate to the semiconductor light-emitting stack, and overlaying top and side surfaces of the semiconductor light-emitting stack with the fluorescent material, wherein the fluorescent material contains no binding material.

18 Claims, 5 Drawing Sheets

Related U.S. Application Data continuation-in-part of application No. 10/604,245, filed on Jul. 4, 2003, now Pat. No. 6,987,287.

(51) Int. Cl.
  *H01L 33/50* (2010.01)
  *H01L 33/42* (2010.01)

(56) References Cited

U.S. PATENT DOCUMENTS

| | | | |
|---|---|---|---|
| 2002/0021085 A1* | 2/2002 | Ng | H01L 33/486 |
| | | | 313/499 |
| 2002/0057056 A1* | 5/2002 | Okazaki | 313/512 |
| 2005/0117334 A1* | 6/2005 | Lee et al. | 362/231 |

* cited by examiner

SEMICONDUCTOR LIGHT-EMITTING DEVICE AND METHOD FOR FORMING THE SAME

CROSS REFERENCE TO RELATED APPLICATIONS

This application is a Divisional of application Ser. No. 13/045,202, filed on Mar. 10, 2011, which is a Divisional of co-pending application Ser. No. 11/160,588, filed on Jun. 29, 2005, which is a Continuation-in-Part of application Ser. No. 10/604,245, filed on Jul. 4, 2003, and for which priority is claimed under 35 U.S.C. §120; and this application claims priority of Application No. 091114688 filed in Taiwan on Jul. 15, 2002 under 35 U.S.C. §119; the entire contents of all of which are hereby incorporated by reference.

BACKGROUND OF THE INVENTION

1. Field of the Invention

The present invention relates to a semiconductor light-emitting device, and more particularly, to a semiconductor light-emitting device having a fluorescent material structure.

2. Description of the Prior Art

Semiconductor light-emitting devices, such as light-emitting diodes (LEDs) and laser diodes (LDs), are characterized by small size, good emitting efficiency, long life-span, high reaction speed, good reliability, and excellent monochromaticity, and have been used widely in electronic devices, cars, signages, and traffic lights. With the achievement of full color LEDs, LEDs have gradually replaced traditional illumination devices, such as fluorescent lamps and incandescent bulbs.

In the past, the white light is usually achieved by using the structure of light-emitting diode chip and fluorescent material, such as fluorescent powder. The fluorescent material is excited by blue light and then emits yellow, or green and red light. The mixture of blue and yellow light; or of blue, green, and red light may generate white light. Nowadays the substrate of a white light-emitting diode is generally made of sapphire ($Al_2O_3$), SiC, or other transparent substrate. In order to ensure that the light emitted by the light-emitting diode will pass through the fluorescent material (fluorescent powder) and blend into the required color, the fluorescent material must entirely cover all the possible light emitted by the light-emitting diode.

However, it is difficult to evenly overlay the fluorescent material around the transparent substrate or the light-emitting diode chip. When the light generated by the light-emitting diode travels through the uneven fluorescent material, the thicker portion of the fluorescent material absorbs more light than the thinner one does. Therefore, the light-emitting diode will display different colors in different directions corresponding to different thicknesses of the fluorescent material. U.S. Pat. No. 6,642,652, which is included herein by reference, discloses a flip-chip light-emitting device having fluorescent material. The patent teaches complicated methods, such as electrophoresis, for evenly covering the light-emitting device with fluorescent material. However, the disclosed methods involve increases in the cost and decreases in the yield of the light-emitting device. Furthermore, the patent cannot achieve a simple solution to the problem of uneven thickness of the fluorescent material over an LED chip.

To avoid the above-mentioned problems, the present invention provides a semiconductor light-emitting device and manufacturing method thereof. Before chip packaging, a fluorescent material structure is formed over the wafer or the chip to avoid color variation caused by uneven thickness of the fluorescent material over the chip.

SUMMARY OF THE INVENTION

It is therefore an object of the invention to provide a method of applying a fluorescent material to a surface to avoid the above-mentioned problems.

The method of applying a fluorescent material to a surface of the claimed invention includes providing a substrate, providing a semiconductor light-emitting stack on the substrate, bonding the substrate to the semiconductor light-emitting stack; and overlaying top and side surfaces of the semiconductor light-emitting stack with the fluorescent material, wherein the fluorescent material contains no binding material.

The method for forming a semiconductor light-emitting device comprises steps of separating a semiconductor light-emitting stack from a growth substrate, bonding the semiconductor light-emitting stack to the light-impervious substrate, and form a fluorescent material structure over the semiconductor light-emitting stack.

These and other objectives of the present invention will no doubt become obvious to those of ordinary skill in the art after reading the following detailed description of the preferred embodiment that is illustrated in the various figures and drawings.

DETAILED DESCRIPTION

Embodiment 1

Figure 1:
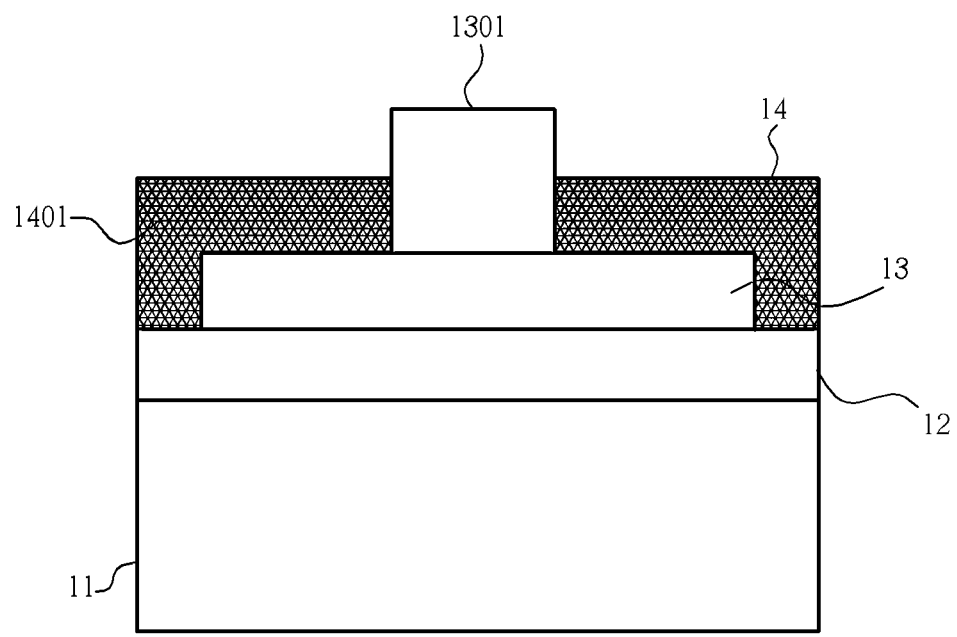
FIGS. 1 to 3 show front views of an embodiment of the semiconductor light-emitting device according to the present invention.
Figure 2:
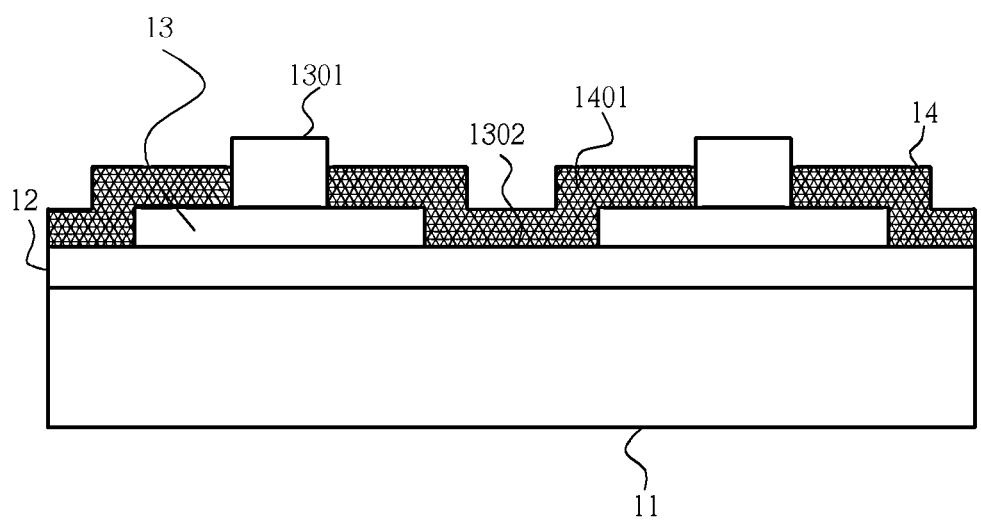
Figure 3:
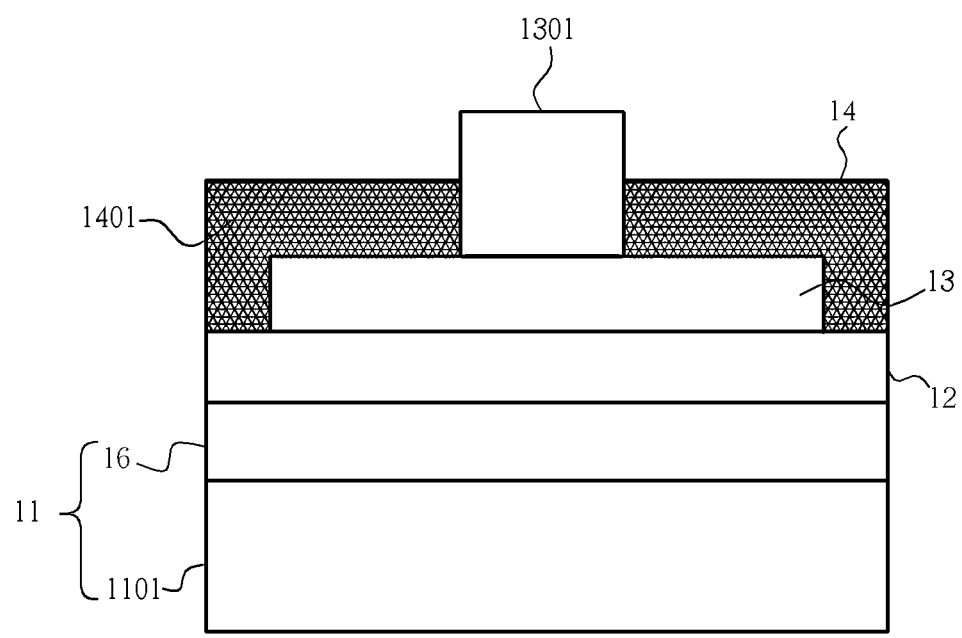

Referring to FIGS. 1 to 3, a semiconductor light-emitting device 10 includes a light-impervious substrate 11, a bonding structure 12, a semiconductor light-emitting stack 13, and a fluorescent material structure 14. The semiconductor light-emitting stack 13 can be subject to a biased current to emit original light, such as the blue light for GaN based light-emitting diode. Since light cannot penetrate the light-impervious substrate 11, the light will move towards the side opposite to the light-impervious substrate 11, i.e., the side of the fluorescent material structure 14. When the original light enters the fluorescent material structure 14, a fluorescent material 1401 inside the fluorescent material structure 14 absorbs original light and is excited to generate converted light which has a wavelength different from that of the original light. The original light and the converted light may mix up to white light preferably. The semiconductor light-emitting stack 13 of the present invention may be a vertical structure (with electrical connections at the opposite sides), or a horizontal structure (with electrical connections at the same side).

The light-impervious substrate 11 of present invention is a semiconductor substrate, a metal substrate, a combination of above materials, or other light-impervious materials. Preferably, the light-impervious substrate 11 comprises a material selected from a group consisting of Si, GaN/Si, GaAs, and any combination thereof. Otherwise, as shown in FIG. 2, the light-impervious substrate 11 is a wafer having a trench 1302 for partitioning more than two semiconductor light-emitting stacks 13. A suitable way is to dice the semiconductor light-emitting stack 13 after the fluorescent material structure 14 is formed.

As shown in FIG. 3, the light-impervious substrate 11 further has a transparent substrate 1101 and a reflective layer 16. The reflective layer 16 is used for reflecting light moving towards the transparent substrate 1101, such that the original light and/or the converted light will be guided to the fluorescent material structure 14 instead of penetrating the transparent substrate 1101. The transparent substrate 1101 comprises a material selected from a group consisting of GaP, SiC, ZnO, GaAsP, AlGaAs, $Al_2O_3$, glass, and any combination of such.

The bonding structure 12 is used for bonding the light-impervious substrate 11 and the semiconductor light-emitting stack 13. The bonding structure 12 can be metal, such as In, Au, Al, and Ag etc. The metal is formed between the light-impervious substrate 11 and the semiconductor light-emitting stack 13 at a predetermined temperature, such as 200° C.~600° C., and serves as a mirror to reflect light moving towards the light-impervious substrate 11. The bonding structure 12 can also form an ohmic contact between the light-impervious substrate 11 and the semiconductor light-emitting stack 13, so that the light-impervious substrate 11 is electrically connected to the semiconductor light-emitting stack 13.

In other way, the bonding structure 12 can be a region adjacent to an interface where the light-impervious substrate 11 directly contacts the semiconductor light-emitting stack 13. The light-impervious substrate 11 and the semiconductor light-emitting stack 13 are bonded together under an appropriate pressure, such as 200 g/cm²~400 g/cm², and a higher temperature, such as 500° C.~1000° C., preferably 550° C.~650° C.

The light-impervious substrate 11 and the semiconductor light-emitting stack 13 are preferably glued together by the bonding structure 12. The gluing process is performed at lower temperature, such as 150° C.~600° C., preferably 200° C.~300° C., and a predetermined pressure, such as 328 g/cm²~658 g/cm², preferably about 505 g/cm², and thereby reduces high-temperature damage to the semiconductor light-emitting stack 13 and achieves a proper bonding effect. The bonding structure 12 comprises a material such as metal, epoxy, PI, BCB, and PFCB, or other substitutes. Moreover, the bonding structure 12 is a transparent material, such as BCB.

When the light-impervious substrate 11 is electrically connected to the semiconductor light-emitting stack 13, an electrical channel is vertically formed. An electrical connection 1301 of the semiconductor light-emitting device 10 can be disposed over the semiconductor light-emitting stack 13, and the light-impervious substrate 11 serves as another electrical connection. Alternatively, another electrical connection can be formed on the light-impervious substrate 11.

The fluorescent material structure 14 is composed of one or more fluorescent materials 1401 capable of absorbing original light generated by the semiconductor light-emitting stack 13 to generate converted light that has a wavelength different from that of the original light. The converted light may have multiple hues by using multiple fluorescent materials 1401. Moreover, the fluorescent material structure 14 is formed over the semiconductor light-emitting device 10 and is substantially in contour conformity with the semiconductor light-emitting stack 13 and thereby simplifies the chip packaging procedure. The fluorescent material 1401 can be formed over the semiconductor light-emitting stack 13 via a binder (not shown). The binder and the fluorescent material 1401 are mixed up and then put over the semiconductor light-emitting stack 13. In other way, the binder is applied to the semiconductor light-emitting stack 13, and then the fluorescent material 1401 is deposited over the binder. Furthermore, other structures (not shown), such as a cup or container, over the semiconductor light-emitting stack 13 may be formed to carry, fill, or package the fluorescent material 1401.

Preferably, the fluorescent material structure 14 only includes the fluorescent material 1401, or is a non-glued fluorescent material structure. The non-glued fluorescent material structure 14 here is defined as a lumped fluorescent material containing no binder, epoxy, or other binding material. The method to lump the fluorescent material 1401 together can be used such as sedimentation or other physical deposition process. The bonding strength between the semiconductor light-emitting stack 13 and fluorescent material structure 14 can be further increased by heating and/or compressing the fluorescent material 1401. The use of the non-glued fluorescent material structure 14 avoids light-absorbing by binder or epoxy and thereby provides better light transformation and color performance.

Although the fluorescent material structure 14 of the above embodiment is formed over the semiconductor light-emitting stack 13, it is not necessary that the fluorescent material structure 14 must directly contact the semiconductor light-emitting stack 13. Instead, another structure, such as a protection layer or optical layer, can be formed between the semiconductor light-emitting stack 13 and the fluorescent material structure 14. Additionally, the fluorescent material structure 14 is in a form of powder, like sulfide powder. Preferably, an average diameter of the powder is between 0.1~100 micrometers.

Embodiment 2

Figure 4:
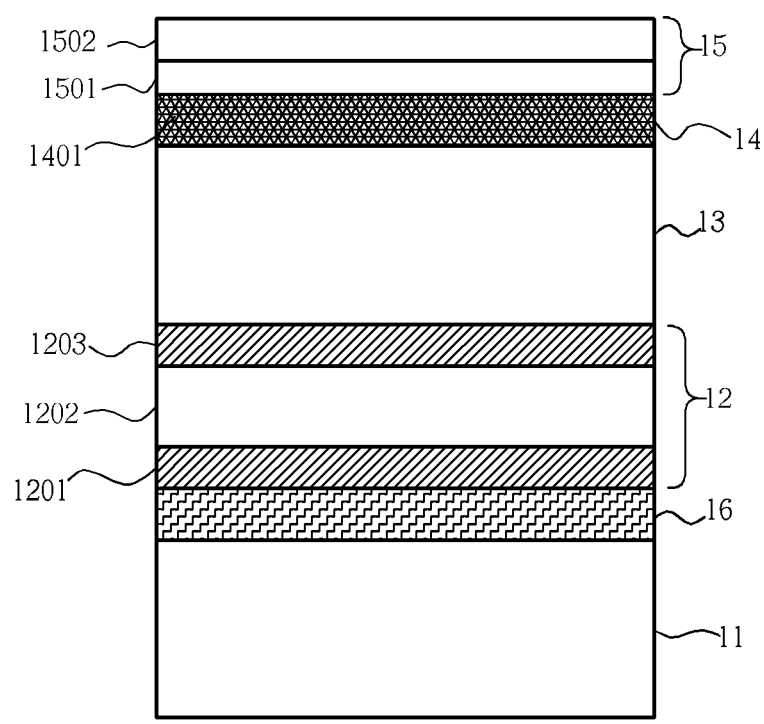
FIGS. 4 and 5 show front views of another embodiment of the semiconductor light-emitting device according to the present invention.
Figure 5:
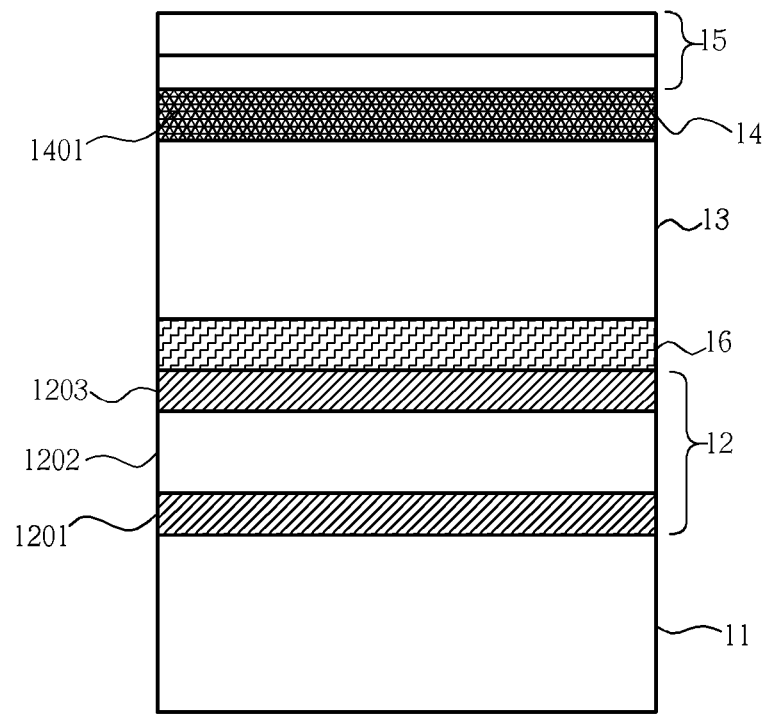

FIGS. 4 and 5 are front views of second embodiment of the present invention. Elements in the second embodiment that are the same as those in the first embodiment have the same denotations, and repeated description of these elements are omitted herein.

As described in the first embodiment, the bonding structure 12 is used for bonding the light-impervious substrate 11 and the semiconductor light-emitting stack 13. In this embodiment, the bonding structure 12 further comprises a first intermediate layer 1201, an adhesive layer 1202 and a second intermediate layer 1203. The first intermediate layer 1201 and the second intermediate layer 1203 are respectively formed over the light-impervious substrate 11 and semiconductor light-emitting stack 13. The adhesive layer 1202 is used to bond the first and second intermediate layers 1201 and 1203. The two intermediate layers 1201 and 1203 are used to increase bonding strength between the adhesive layer 1202 and the light-impervious substrate 11, and between the adhesive layer 1202 and the semiconductor light-emitting stack 13.

The adhesive layer 1202 of the bonding structure 12 is such as epoxy, PI, BCB, PFCB, or other organic adhesive material. The first and second intermediate layers 1201 and 1203 are $SiN_x$, Ti, Cr, or other materials for increasing the bonding strength between the adhesive layer 1202 and the light-impervious substrate 11, and/or between the adhesive layer 1202 and the semiconductor light-emitting stack 13.

As shown in FIGS. 4 and 5, the semiconductor light-emitting device 10 further has a protection structure 15 formed over the fluorescent material structure 14 for protecting the fluorescent material structure 14 and other structures below the fluorescent material structure 14 from humidity, shock, etc. The protection structure 15 comprises a material such as Su8, BCB, PFCB, epoxy, acrylic resin, COC, PMMA, PET, PC, polyetherimide, fluorocarbon polymer, silicone, glass, any combination of above materials, or other materials pervious to light.

The protection structure 15 further includes a plurality of optical layers 1501 and 1502, each optical layer having a different thickness. Each thickness of the optical layers 1501 and 1502 preferably increases with a distance from the semiconductor light-emitting stack 13, i.e. the thickness of the outer layer is thicker than that of the inner layer. In this embodiment, the thickness of the optical layer 1502 is thicker than that of the optical layer 1501. The thickness variation of the optical layers 1501 and 1502 can release the thermal stress caused by the semiconductor light-emitting device 10 on the protection structure 15 so as to prevent the protection structure 15 from cracking. The plurality of optical layers 1501 and 1502 can be diffuser, light-gathering layer, i.e. lens, or other structure capable of adjusting light emitting properties of the semiconductor light-emitting device 10.

The semiconductor light-emitting device 10 further has a reflective layer 16 for reflecting light moving towards the light-impervious layer 11 and guiding light to the fluorescent material structure 14. The reflective layer 16 can be disposed between the bonding structure 12 and the light-impervious layer 11, and therefore the bonding structure 12 is transparent, as show in FIG. 4. In other hand, the reflective layer 16 can be disposed between the bonding structure 12 and the semiconductor light-emitting stack 13, as shown in FIG. 5. Moreover, the reflective layer 16, such as a Bragg reflector, can be formed within the semiconductor light-emitting stack 13 (not shown).

The material of the reflective layer 16 is such as metal, oxide, a combination of above materials, or other materials for reflecting light. Preferably, the reflective layer 16 comprises a material selected from a group consisting of In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, and MgO.

The semiconductor light-emitting stack 13 of the present invention further comprises a transparent conductive layer (not shown) for spreading current, or for forming an ohmic contact with other layers, such as p type semiconductor layer or n type semiconductor layer. The material of the transparent conductive layer is indium tin oxide (ITO), cadmium tin oxide (CTO), antimony tin oxide, zinc oxide, zinc tin oxide, Ni/Au, NiO/Au, TiWN, or transparent metal layer.

Embodiment 3

Please refer to FIGS. 1 to 5 again. The method for manufacturing the semiconductor light-emitting device 10 of the present invention comprises steps for separating the semiconductor light-emitting stack 13 from a growth substrate (not shown), bonding the semiconductor light-emitting stack 13 to the light-impervious substrate 11, and forming the fluorescent material structure 14 over the semiconductor light-emitting stack 13. The bonding step is to form a bonding structure between the semiconductor light-emitting stack 13 and the light-impervious substrate 11. Alternatively, the bonding step is to directly bond the semiconductor light-emitting stack 13 to the light-impervious layer 11 at a predetermined temperature and pressure, such as 500° C.~1000° C., preferably 550° C.~650° C., and 200 g/cm²~400 g/cm². The bonding structure 12 can be an adhesive layer (not shown) for gluing the semiconductor light-emitting stack 13 and the light-impervious layer 11 under a predetermined temperature, such as 150° C.~600° C., preferably 200° C.~300° C., and a predetermined pressure, such as 328 g/cm²~658 g/cm², preferably about 505 g/cm². The bonding structure 12 can also be a metal layer (not shown), which is bonded with the semiconductor light-emitting stack 13 and the light-impervious layer 11 at an appropriate temperature, such as 200° C.~600° C., and pressure. The metal layer can also serve as a mirror for reflecting light.

Preferably, the bonding step comprises forming the first intermediate layer 1201 over the light-impervious layer 11, forming the second intermediate layer 1203 over the semiconductor light-emitting stack 13, and bonding the semiconductor light-emitting stack 13 and the light-impervious layer 11 via the adhesive layer 1202. The adhesive layer 1202 is formed between the first and second intermediate layers 1201 and 1203. The first and second intermediate layers 1201 and 1203 can enhance the bonding strength between the adhesive layer 1202 and the semiconductor light-emitting stack 13, and between the adhesive layer 1202 and the light-impervious layer 11.

The fluorescent material structure 14 is preferably formed over the semiconductor light-emitting stack 13 by sedimentation of the fluorescent material 1401, or by the mixture of the fluorescent material 1401 and a binder, such as epoxy.

A protection structure 15 can also be formed over the fluorescent material structure 14. The protection structure 15 can include a plurality of layers 1501 and 1502 so as to protect other structures below the protection structure 15 from the humidity and shock, or release the thermal stress occurred at high temperature.

Moreover, the present invention forms the reflective layer 16 between the light-impervious substrate 11 and the bonding structure 12, or between the bonding structure 12 and the semiconductor light-emitting stack 13. Alternatively, the reflective layer 16, such as a Bragg reflective layer, is formed within the semiconductor light-emitting stack 13 to reflect light.

Additionally, the fluorescent material structure 14 can be formed on a wafer or a chip. If the fluorescent material structure 14 is formed on the wafer, a trench 1302 is designed on the semiconductor light-emitting stack 13, and then the fluorescent material structure 14 is formed over the semiconductor light-emitting stack 13. Then, the wafer is diced by the trench 1302 after the formation of the fluorescent material structure 14 or the protection structure 15, such that the chips of the semiconductor light-emitting devices 10 are made.

It will be obvious to those skilled in the art that changes and modifications may be made to the embodiments of the present invention without departing from the invention in its broader aspects and, therefore, the appended claims are to encompass within their scope all such changes and modifications as fall within the spirit and scope of this invention.

The invention claimed is:

1. A method of applying a fluorescent material to a surface, comprising:
   providing a substrate;
   providing a semiconductor light-emitting stack for emitting a blue light on the substrate;
   bonding the substrate to the semiconductor light-emitting stack; and overlaying top and side surfaces of the semiconductor light-emitting stack with a fluorescent structure, wherein the fluorescent structure has an outermost surface separated from the top surface and comprises the fluorescent material for absorbing the blue light; and forming a trench on the outermost surface, wherein the fluorescent material contains no binding material, and wherein the outermost surface includes a flat surface in the trench.

2. The method of claim 1, further comprising:
forming a bonding structure between the substrate and the semiconductor light-emitting stack; and
overlaying a top surface of the bonding structure with the fluorescent material.

3. The method of claim 1, wherein the step of overlaying top and side surfaces of the semiconductor light-emitting stack with the fluorescent material further arranging the trench on the substrate devoid of the semiconductor light-emitting stack.

4. The method of claim 1, further comprising:
forming a first electrical connection on the semiconductor light-emitting stack.

5. The method of claim 1, further comprising:
forming an ohmic contact between the substrate and the semiconductor light-emitting stack.

6. The method of claim 1, further comprising:
providing a protection layer or an optical layer over the fluorescent material and the semiconductor light-emitting stack.

7. The method of claim 1, further comprising:
heating the fluorescent material.

8. The method of claim 1, further comprising:
compressing the fluorescent material.

9. The method of claim 1, wherein the step of providing the semiconductor light-emitting stack comprises forming the semiconductor light-emitting stack on a growth substrate.

10. The method of claim 9, further comprising:
separating the growth substrate from the semiconductor light-emitting stack.

11. A method of applying a fluorescent material to a surface, comprising:
providing a plurality of semiconductor light-emitting stacks for emitting a blue light;
providing a first electrical connection on one of the plurality of semiconductor light-emitting stacks;
forming a fluorescent structure which contains the fluorescent material devoid of binding material;
overlaying top and side surfaces of the semiconductor light-emitting stack with the fluorescent structure for absorbing the blue light, wherein the fluorescent structure has an outermost surface separated from the top surface; and
forming a trench on the outermost surface,
wherein the outermost surface includes a flat surface in the trench.

12. The method of claim 11, wherein the step of overlaying top and side surfaces of the semiconductor light-emitting stack with the fluorescent structure further comprises arranging the trench on the substrate devoid of the plurality of the semiconductor light-emitting stacks.

13. The method of claim 11, further comprising:
providing a binder between the fluorescent structure and the plurality of semiconductor light-emitting stacks.

14. The method of claim 11, further comprising:
providing a substrate;
providing a bonding structure; and
bonding the substrate to the plurality of semiconductor light-emitting stacks with the bonding structure.

15. The method of claim 14, further comprising:
overlaying a top of the bonding structure with the fluorescent material.

16. The method of claim 11, further comprising:
providing a protection layer or an optical layer over the fluorescent structure and the semiconductor light-emitting stacks; and providing a reflective layer between the semiconductor light-emitting stacks and the substrate.

17. The method of claim 1, wherein the semiconductor light-emitting stack comprises Ga and N.

18. The method of claim 1, wherein the fluorescent material is formed by a physical deposition process.

* * * * *